United States Patent [19]
Taylor

[11] Patent Number: 6,091,272
[45] Date of Patent: *Jul. 18, 2000

[54] LOW POWER CLOCK SQUARER WITH TIGHT DUTY CYCLE CONTROL

[75] Inventor: Clive Roland Taylor, Herrfordshire, United Kingdom

[73] Assignee: VLSI Technologies, Inc., San Jose, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/993,244

[22] Filed: Dec. 18, 1997

[51] Int. Cl.$^7$ ...................................................... H03K 3/017
[52] U.S. Cl. .......................... 327/175; 327/184; 327/291; 327/299
[58] Field of Search ..................................... 327/184, 175, 327/104, 291, 298, 299, 164, 205, 206, 171, 172; 341/135, 136, 124, 165

[56] References Cited

U.S. PATENT DOCUMENTS

| | | | |
|---|---|---|---|
| 4,072,870 | 2/1978 | Davis | 327/65 |
| 4,110,641 | 8/1978 | Payne | 327/67 |
| 4,689,819 | 8/1987 | Killion | 381/68 |
| 4,728,815 | 3/1988 | Main | 327/184 |
| 5,414,354 | 5/1995 | Bushman | 327/184 |

*Primary Examiner*—Tuan T. Lam
*Assistant Examiner*—Hai L. Nguyen
*Attorney, Agent, or Firm*—Burns Doane Swecker & Mathis L.L.P.

[57] ABSTRACT

The present invention is directed to a method and apparatus for producing a square wave output signal with a clock circuit that possesses characteristics of low current consumption, relatively tight duty cycle control, and versatility over a wide range of voltages and input signal frequencies down to, and including DC. Exemplary embodiments receive an input signal, and process the input signal into an output square wave signal. A processing of the input signal is achieved using at least one current mirror for controlling a duty cycle of the output square wave signal said at least one current mirror being implemented in part with at least one pair of cascoded transistors. The processing is further achieved with an output stage having at least one inverter operatively connected with a node between the transistors of the at least one pair of cascoded transistors to control switching of the at least one pair of cascoded transistors.

15 Claims, 5 Drawing Sheets

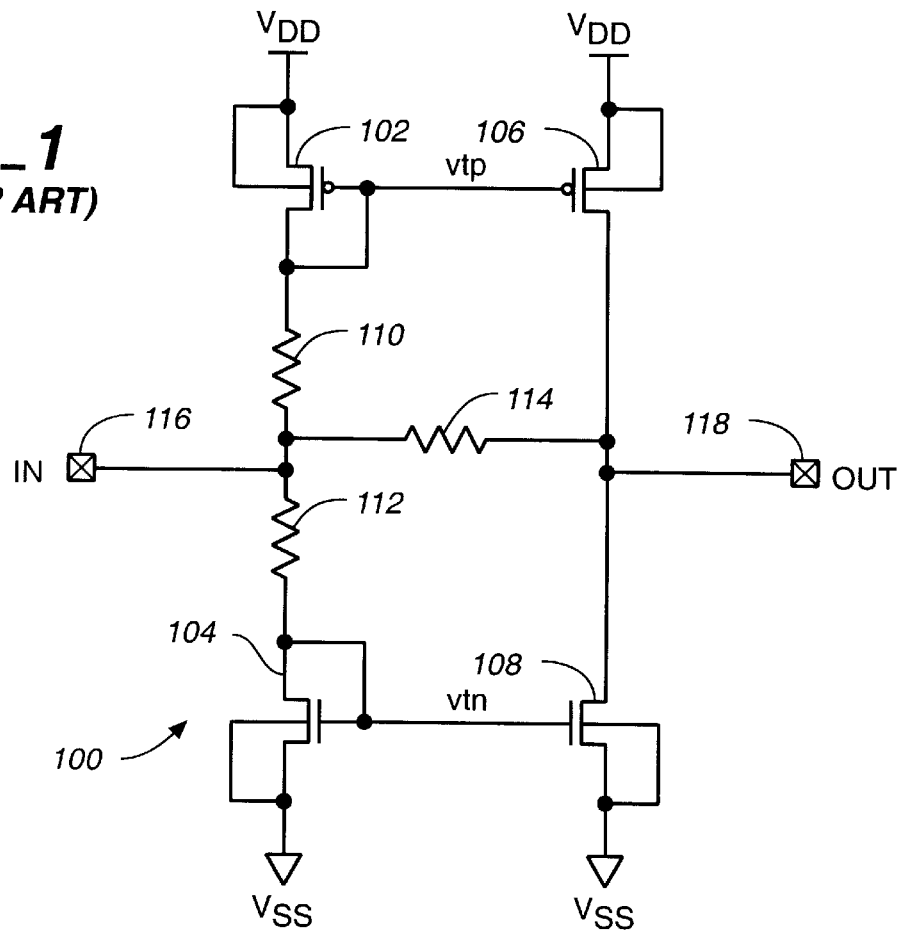
FIG._1
(PRIOR ART)
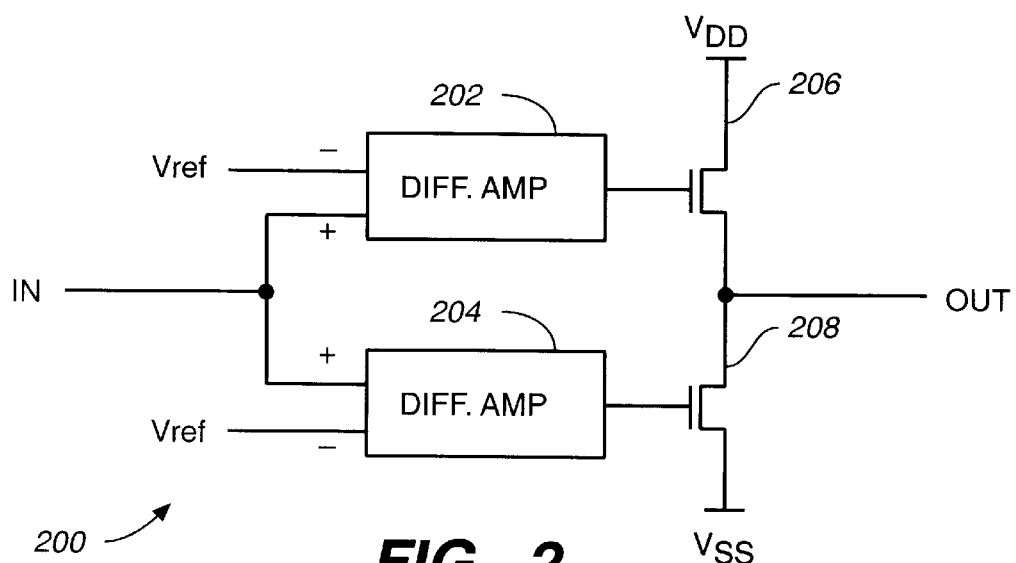
FIG._2
(PRIOR ART)

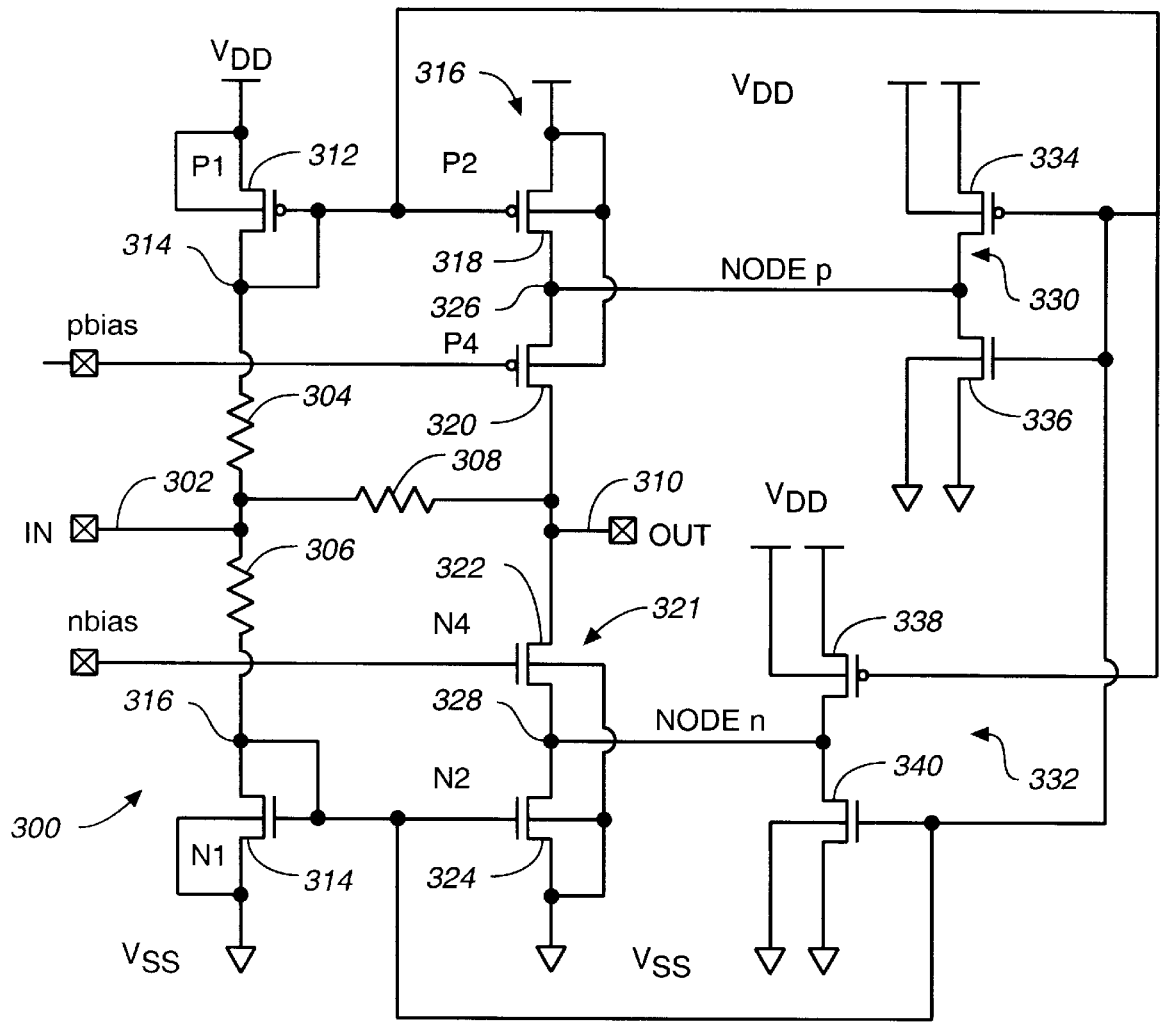
FIG._3

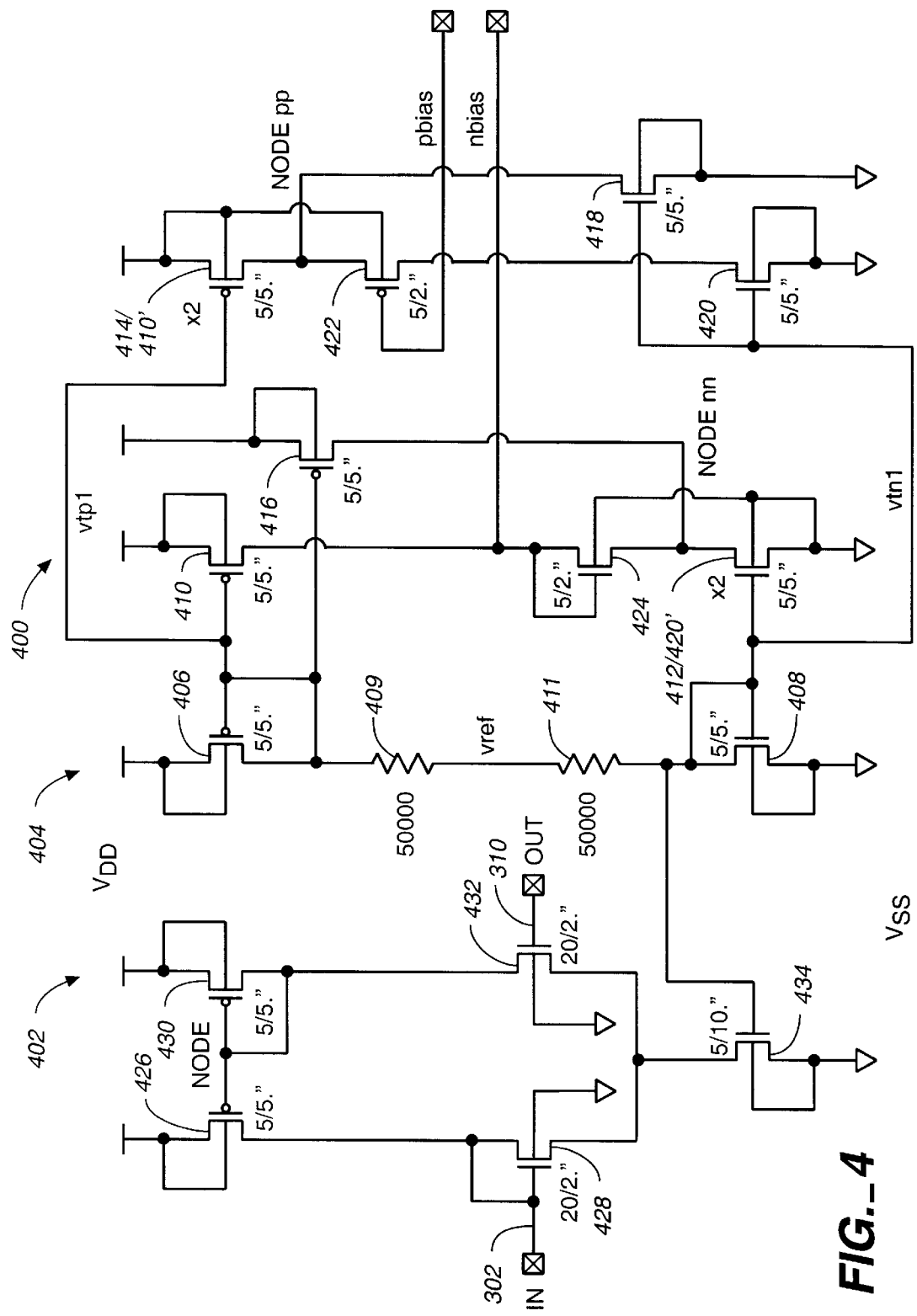
FIG._4

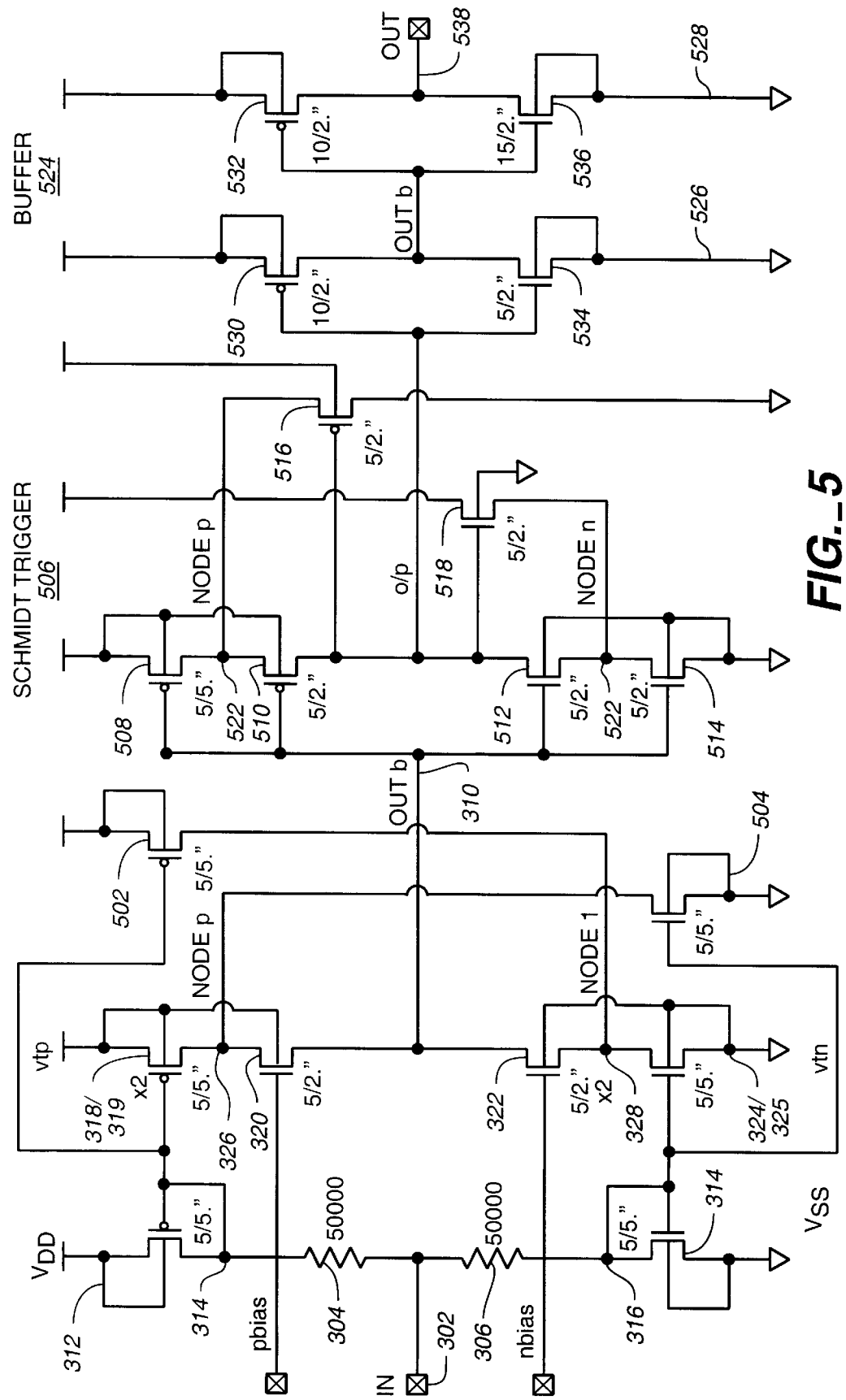
FIG._5

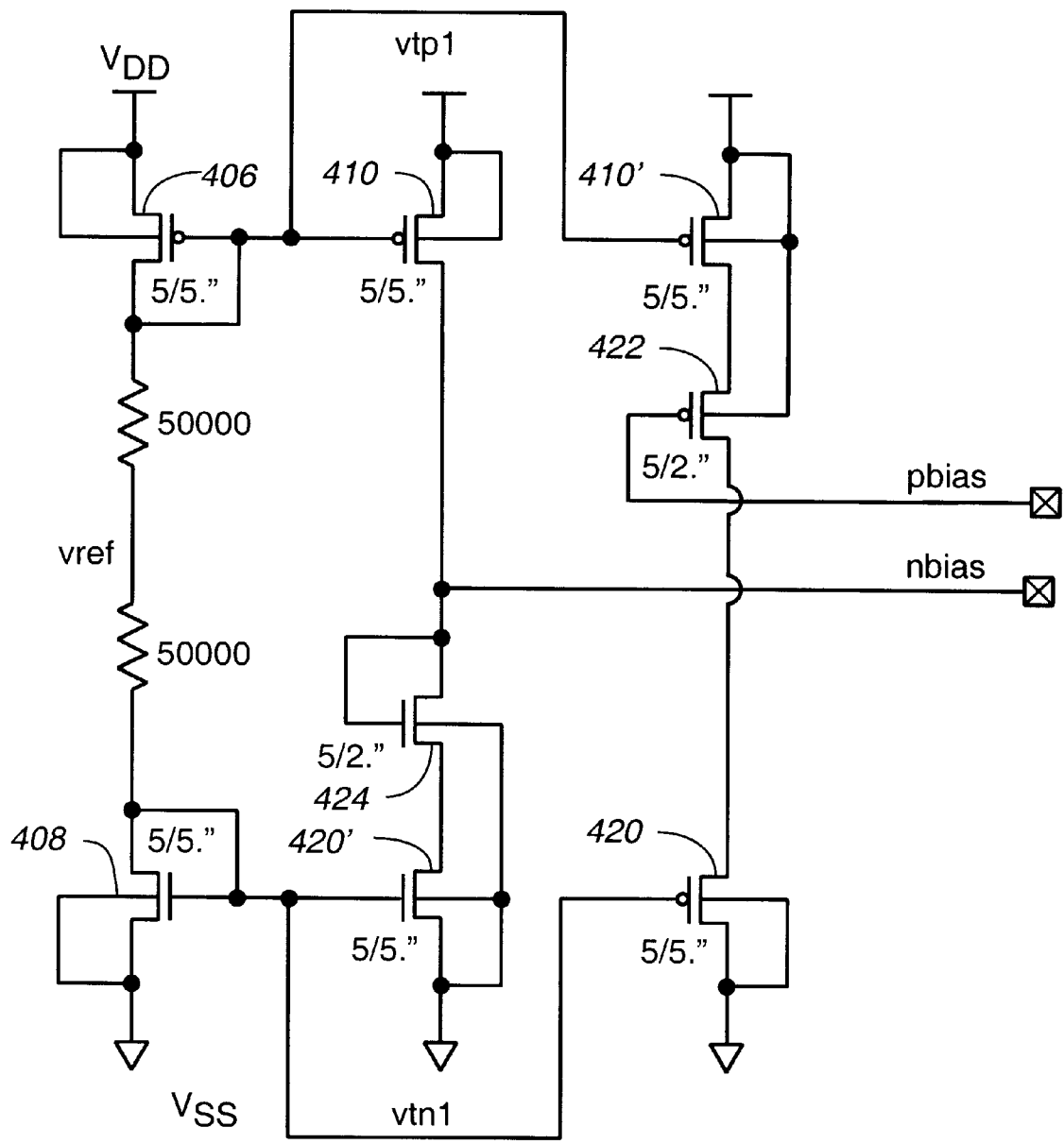
FIG._6

6,091,272

LOW POWER CLOCK SQUARER WITH TIGHT DUTY CYCLE CONTROL

BACKGROUND OF THE INVENTION

1. Field of the Invention

The present invention relates generally to signal processing circuits, and more particularly, to methods and circuits for processing input signals into square wave signals.

2. State of the Art

Circuits for processing input signals into square wave signals are known, such as Schmidt trigger circuits. However, Schmidt trigger circuits cannot provide the tight duty cycle control required for use as a system clock in circuits such as portable, battery powered telephone circuits and modems. In these applications, low amplitude sine wave signals on the order of 0.4 volts or lower are used to minimize electromagnetic radiation by eliminating sideband harmonics. Circuits such as portable telephones and modems also require a minimization of current consumption to preserve battery life.

A typical clock for use in battery powered circuits includes a local sine wave oscillator which outputs a sine wave of 13 megahertz (MHZ) and an amplitude of 0.4 volts to 1.2 volts. The sine wave is converted to a square wave that is then amplified to correspond with the supply voltage range of components in the circuit, such as a range of 3 volts where a low level voltage $V_{SS}$ is at circuit ground (i.e., 0 volts) and a high level voltage $V_{DD}$ is on the order of 3.0 volts. These circuits must also have the versatility of working with different frequency ranges, such as from DC to 20 MHZ to accommodate different circuit applications.

A clock circuit configured as a clock squarer amplifier 100 is shown in FIG. 1 as including two diode configured input transistors 102, 104 and two output transistors 106, 108 used to configure current mirrors. The transistors 102, 106 are illustrated as p-type transistors having their gates interconnected, having their sources connected to the source voltage $V_{DD}$, and having their drains connected to drains of transistors 104, 108. The gates of n-type transistors 104, 108 are also interconnected, and the sources transistors 104, 108 are connected to the circuit ground, $V_{SS}$. In the FIG. 1 circuit, the drains of transistors 102, 104 are interconnected via series connected resistors 110, 112 which "swamp out" the effective resistance of the diode configured input transistors 102, 104. The resistors 110, 112 are, for example, on the order of 10 kilo-ohms and together with a resistor 114 connected between an input 116 and an output 118, provide a resistive feedback circuit for establishing a bias point. This bias point sets the duty cycle of the output waveform (for example, at a duty cycle value of 50%).

As those skilled in the art will appreciate, the FIG. 1 circuit provides relatively good duty cycle regulation. However, this duty cycle regulation comes at the expense of high current consumption due to the poor drive ratio of the diode configured input transistors 102, 104.

During operation of the FIG. 1 circuit in a sine wave input mode (that is, where a sine wave is supplied to the input 116), current through the output transistors 106, 108 creates a crowbar current in the output stage from the source voltage $V_{DD}$ to the circuit ground $V_{SS}$. This crowbar current in the output stage is a multiple of crowbar current which exists in the input stage due to incomplete shutoff of the transistors 102–108. The relatively high current in the output stage charges capacitances of the transistors included therein which must be overridden when switching the output stage transistors on or off, resulting in increased current consumption. In the sine wave input mode, the current consumption is amplitude dependent because the input stage operates as a voltage divider. The current consumption becomes especially high in a square wave input mode, not because of crowbar currents in the circuit, but because of large consumption within the input stage.

The physical size of the FIG. 1 circuit is of concern in the portable circuit applications mentioned previously, wherein packaging of the circuit as an integrated circuit is desirable. As such, current consumption cannot be reasonably decreased without an undesired increase in circuit size.

The relatively high current consumption of the FIG. 1 circuit can be traced to the large physical size of the diode configured input transistors 102, 104 and to the mirror transistors 106, 108. The transistors 106, 108 are typically eight times larger than the size of the input transistors 102, 104. Although inclusion of larger resistors 110, 112 would decrease current consumption at the input stage, the physical size of resistors 110, 112 is practically limited by size constraints when attempting to configure the circuit on a chip as an integrated circuit.

Those skilled in the art will appreciate that rather than increasing the size of the resistors 110, 112, decreased current consumption can also be achieved by increasing the channel length of transistors 102, 104 to thereby increase the voltage drop at these transistors. However, overall circuit size constraints renders such a solution impractical because any increased channel length of transistors 102, 104 requires a proportional increase in the channel length of transistors 106, 108. Because transistors 106, 108 are typically on the order of eight times larger than the transistors 102, 104, any such increase in the channel length of these transistors renders overall circuit size impractical. Given the size constraints imposed on the FIG. 1 circuit, a relatively high current consumption is deemed an acceptable tradeoff for the duty cycle control.

FIG. 2 shows another example of a clock circuit 200 configured as a differential stage clock squarer to achieve a relatively low current consumption at the expense of duty cycle control. The FIG. 2 circuit is configured with differential amplifiers 202, 204 which function as current sources, and output stage transistors 206, 208. Low current consumption is achieved in the FIG. 2 circuit as a result of using current sources to limit current. However, duty cycle control is compromised because of the difficulty in matching characteristics of the two differential amplifiers 202, 204. The FIG. 2 circuit also suffers from limited operating voltages which restrict versatility of the circuit. For example, the differential amplifiers 202, 204 include a configuration of cascoded transistors that inhibits the circuit from operating at low voltages.

Accordingly, it would be desirable to devise a clock circuit which possesses the advantages of low current consumption and tight duty cycle control, yet which remains versatile over relatively wide voltage and frequency ranges that include the low voltages desired for battery driven systems.

SUMMARY OF THE INVENTION

The present invention is directed to a method and apparatus for producing a square wave output signal with a clock circuit that possesses characteristics of low current consumption, relatively tight duty cycle control, and versatility over a wide range of voltages and input signal frequencies down to, and including DC. Exemplary embodiments receive an input signal, and process the input signal into an output square wave signal. A processing of the input signal is achieved using at least one current mirror for controlling a duty cycle of the output square wave signal said at least one current mirror being implemented in part with at least one pair of cascoded transistors. The processing is further achieved with an output stage having at least one inverter operatively connected with a node between the transistors of the at least one pair of cascoded transistors to control switching of the at least one pair of cascoded transistors.

A means for receiving the input signals can include matched p-type and n-type current sources. Processing means can include matched p-type and n-type current mirrors implemented with cascoded transistors having a node at a junction between the transistors in each cascoded pair. The processing means can further include an inverter for each node between the transistors of each cascoded transistor pair. With such a configuration, the nodes between the transistors in each cascoded pair can be established as limited voltage swing nodes that permit transistors of the cascoded pairs to be turned fully off and turned sufficiently on by small amplitude signals, thereby minimizing current consumption while providing a high degree of duty cycle control over a wide range of operating voltages and frequencies.

BRIEF DESCRIPTION OF THE DRAWINGS

The present invention can be further understood with reference to the following description and the appended drawings, wherein like elements are provided with the same reference numerals. In the drawings:

FIG. 1 illustrates a conventional clock circuit;

FIG. 2 illustrates another conventional clock circuit;

FIG. 3 illustrates a clock circuit in accordance with an exemplary embodiment of the present invention;

FIG. 4 illustrates an exemplary circuit for generating bias signals for use with the exemplary FIG. 3 embodiment;

FIG. 5 illustrates an alternate exemplary embodiment of the FIG. 3 clock circuit with a downstream Schmidt trigger and buffer; and FIG. 6 illustrates an alternate exemplary implementation of the FIG. 4 bias circuit.

DETAILED DESCRIPTION OF THE PREFERRED EMBODIMENTS

FIG. 3 illustrates an apparatus, configured as a clock circuit 300, for producing a square wave output signal. The clock circuit 300 includes a receiving input means represented as a signal input 302 connected to a junction between input resistors 304 and 306. A feedback resistance 308 is connected to a junction between resistors 304, 306 to series connect signal input 302 to a signal output 310. In an exemplary embodiment, the resistors 304, 306 and 308 can be on the order of 50 kilo-ohms.

Processing of the input signal can be achieved using the voltage divider established by the resistors 304, 306, 308 and associated diode configured input transistors 312, 314. The diode configured input transistors 312, 314 are configured in series fashion with the resistive voltage divider in a manner similar to that of FIG. 1, with the diode configured input transistor 312 being a p-type transistor connected between the resistive voltage divider and the source voltage $V_{DD}$, and with the diode configured input transistor 314 being an n-type transistor series connected between the resistive voltage divider and the circuit ground $V_{SS}$.

The processing means of the exemplary FIG. 1 circuit further includes a first pair 316 of cascoded transistors 318 and 320 of a first conductivity, and a second pair 321 of cascoded transistors 322 and 324 of a second conductivity. For example, the transistors 318, 320 are p-type transistors while the transistors 322, 324 are n-type transister. Nodes 326 and 328 are established at junctions between the transistors in each of the cascoded pairs 316, 321, with the node 326 being a p-node at a junction between series connected p-type transistors 318, 320, and with the node 328 being an n-node formed at a junction between series connected n-type transistors 322, 324. The transistors 318 and 324 are connected to constitute part of the current mirrors, with their gates being respectively connected with the gates of diode configured input transistors 312, 314. Bias signals designated "p-bias" and "n-bias" are connected respectively to the gates of the cascoded transistors 320, 322 in each cascoded pair.

In accordance with the exemplary FIG. 3 clock circuit, inverters 330 and 332 are provided to act upon the nodes 326, 328 respectively. The inverter 330 includes a series connected p-type transistor 334 and an n-type transistor 336. The inverter 332 includes a series connected p-type transistor 338 and n-type transistor 340. The p-type transistors 334 and 338 are driven by a first current mirror established by transistors 312, 318. The n-type transistors 336 and 340 of the inverters 330, 332 are driven by a second current mirror established by transistors 314 and 324.

In operation, each of the cascoded pairs 316, 321 establish the nodes 326, 328 as limited voltage swing nodes that enable the cascoded pairs to be turned fully off and to be turned sufficiently on (that is, sufficiently on to achieve proper circuit operation) by small amplitude signals. By enabling small amplitude signals to switch the transistors in the cascoded pairs on and off, crowbar currents can be minimized. As such, the clock circuit 300 effectively only requires sufficient drive current to charge and discharge any associated parasitic capacitances in the processing means, such that transistors can be used having minimum aspect ratios (that is, relatively small channel lengths). For example, where the input signal to the clock circuit is a sine wave having a 0.4 peak-to-peak voltage, the nodes 326 and 328 can turn off the transistors 326 and 322 using a voltage on the order of millivolts or less (e.g., 200 millivolts or less) and eliminate crowbar current in the output stage.

By including two pairs of cascoded transistors and two inverters, all of the transistors used in the FIG. 3 clock circuit 300 can be of comparable physical size, thereby eliminating an output stage which includes transistors that are a multiple of the diode configured input transistors. To maintain this consistency throughout the circuit, the transistors in the inverter can be doubled up as shown in the FIG. 3 circuit. By maintaining equal sized transistors throughout the FIG. 3 circuit, equal capacitances are maintained throughout. Because the FIG. 3 circuit is a current mode circuit, concerns with transconductance are eliminated and relatively low current consumption can be achieved.

In operation, crowbar currents in the FIG. 3 processing means are eliminated by turning either the p-channel transistor 320 or the n-channel transistor 322 completely off. For example, with 50 millivolts at the drain of the diode configured input transistors 312 and 314, an adequate voltage swing is achieved at the p-node 326 and n-node 328 to produce a square wave at signal output 310. Voltage swings of as little as 200 millivolts or less at the p-node 326 and/or n-node 328 can effectively turn the transistors 320 and 322 of the cascoded pairs into an off condition.

The inclusion of two transistors in each of the inverters 330, 332 renders the FIG. 3 clock circuit more efficient in turning off the transistors 320 and 322 of the cascoded pairs by multiplying the gain of the voltage present at the drains of the diode configured input transistors 312, 314.

By supplying the output from inverters 330, 332 to the p-node 326 and the n-node 328, not only can the transistors 320 and 322 of the cascoded pairs be completely turned off to avoid crowbar currents, but in addition, these transistors can be more easily turned off than they can be turned on. As such, the transistors 320 and 322 can be turned on a slight amount to reduce current consumption in the manner described previously. In addition, because the transistor 320 will always be turned off before the transistor 322 is turned on, and vice versa, a complete elimination of crowbar current in the output stage in the FIG. 3 clock circuit can be achieved.

Thus, in the exemplary FIG. 3 embodiment, an input signal, such as an input sine wave, is converted to equal p-channel and n-channel variable current sources via the transistors 312 and 314, respectively. The variable current sources mirror current to the p-node 326 and the n-node 328 via transistors 318 and 322, with the result being a supply of currents to the output node 310 which are equal and opposite. By using p-type and n-type transistors having equalized characteristics (that is, equalized aspect ratios), approximately identical charge/discharge cycles can be achieved at the output 310 thereby optimizing duty cycle characteristics by minimizing parasitic capacitances.

An optimum level of operation can be reached when an output voltage swing of the inverter is equal or greater than a saturation voltage of the inverter (i.e., vdsat) plus the threshold voltage of the transistor (vt). That is, "p-bias" is equal to vtp 30 vdsat, and "n-bias" is equal to vtn+vdsat. As such, the drive of the inverters must be set greater than or equal to the ratio of transistor 324 to transistor 316 to dictate circuit performance for small amplitude input signals. Because the cascoded transistors 320 and 322 are relatively insensitive to matching, a low drive strength, minimum aspect ratio can be used for these transistors. In operation, the voltage swing on the nodes 326 and 328, can, in accordance with exemplary FIG. 3 embodiment, be greater than two times the value (vt—200 millivolts).

FIG. 4 illustrates an exemplary embodiment of a bias circuit 400 for generating the "p-bias" and "n-bias" signals of FIG. 3. In addition to a bias circuit 400, an active feedback circuit 402 can be included to assist in generation of the "p-bias" and n-bias" signals. Referring to FIG. 3, the "p-bias" and "n-bias" signals drive the gates of the transistors 320, 322 respectively in the cascoded pairs with sufficient current to enable them to be turned completely off, or turned on by a slight amplitude swing at the nodes 326, 328 respectively. While the generation of the "p-bias" and "n-bias" signals can be achieved in any manner apparent to those skilled in the art, the exemplary FIG. 4 circuit is provided as one such implementation.

In FIG. 4, the bias circuit 400 includes an input reference stage 404 comprising diode configured p-type and n-type input transistors 406, 408, respectively. The transistors 406 and 408 are series connected between the source voltage $V_{DD}$ and the circuit ground $V_{SS}$, with a resistance represented by resistors 409, 411, being interconnected between the drains of transistors 406 and 408. The transistors 406 and 408, in conjunction with transistors 410, 412 establish current mirrors that drive output stage p-type transistors 414, 416 and n-type transistors 418, 420. Note that the transistors 412 and 414 are designated "x2", indicating that they actually are configured with two transistors. The second transistor associated with transistor 412 is designated 420' because it mimics the output of transistor 420. The second transistor associated with transistor 414 is designated 410' because it mimics the output of transistor 410.

Bias signal generating transistors 422, 424 produce the "p-bias" and "n-bias" signals, respectively. As with the FIG. 3 circuit, all of the transistors in the FIG. 4 bias circuit can be of comparable physical size to minimize parasitic capacitances.

The active feedback circuit 402 of the FIG. 4 circuit is optional to replace feedback resistance 308. The active feedback circuit 402 can include p-type and n-type input transistors 426, 428, respectively. The feedback circuit can further include output p-type and n-type transistors 430, 432, respectively. Gates of the input transistor 428 and the output transistor 432 can be connected to the FIG. 3 signal input 302 and signal output 310, respectively. Sources of the n-type transistors 428, 432 are interconnected with a drain of an n-type drive transistor 434, whose source is connected with the circuit ground and whose gate is connected to the drain of the diode configured input transistor 408.

FIG. 5 illustrates an alternate exemplary embodiment of the invention wherein the inverters 330, 332 of FIG. 3 are implemented using p-type transistor 502, n-type transistor 325 and n-type transistor 504, p-type transistor 321, respectively. Furthermore, the feedback resistance 308 has been eliminated and can be replaced by, for example, the active feedback circuit 402. Note that in the FIG. 5, transistors 318/319 and 324/325 are implemented using two transistors (that is, note the "x2" designation).

FIG. 5 further illustrates optional use of a Schmidt trigger 506 to further sharpen edges of a square wave produced on signal output 310. The exemplary Schmidt trigger 506 includes series connected p-type input transistors 508, 510 and series connected n-type transistors 512, 514, the gates of which are all connected to the signal output 310. Interconnected drains of the transistors 510, 512 drive an output stage comprising a p-type transistor 516 and an n-type transistor 518, the sources of which are connected to nodes 520, 522 located at the source/drain junctions between each of the respective p-type and n-type transistor pairs of the input stages. The drain node connection between transistors 510, 512 also supplies the Schmidt trigger output to an optional two-stage buffer 524. In the exemplary FIG. 5 embodiment, the Schmidt trigger circuit has its DC bias level set to lie closer to $V_{SS}$ than to $V_{DD}$ (as is the case with the FIG. 3 circuit) by using n-type and p-type transistors having matched characteristics (that is, matched aspect ratios).

The two-stage buffer 524 can include a first stage 526 and a second stage 528, each comprising a series connected p-type transistor 530 or 532 and an n-type transistor 534 or 536. An output 538 of the buffer constitutes a square wave signal output having relatively sharp edges.

FIG. 6 illustrates an alternate embodiment of the bias circuit 400 discussed previously with respect to FIG. 4. In the exemplary FIG. 6 embodiment, the bias circuit 400 has been modified to provide a simplified bias circuit 600. Transistors which correspond to those of the FIG. 4 bias circuit are similarly labeled. Although the simplified bias circuit 600 operates in a fashion similar to that of the FIG. 4 bias circuit, those skilled in the art will appreciate that chip space is reduced with the elimination of transistors 414, 416, 412 and 418. Other circuit modifications will be apparent to those skilled in the art and can of course, be implemented in accordance with exemplary embodiments of the present invention to generate the "p-bias" and "n-bias" signals.

While the foregoing exemplary embodiments have been described in the context of p-type and n-type transistors, those skilled in the art will appreciate that the specific components selected to implement the function of any transistor can be modified by the user. For example, n-type transistor functions can be implemented using p-type transistor functions and vice versa. Similarly, any technology can be used to implement transistor functions including bipolar transistor technology, metal oxide semiconductor technology and so forth.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed Is:

1. Apparatus for producing a square wave output signal, the apparatus comprising:

means for receiving an input signal; and means for processing said input signal into an output square wave, said processing means further including:

at least one current mirror for controlling a duty cycle of said output square wave signal, said at least one current mirror being implemented in part with at least one pair cascoded transistors; and at least one inverter operatively connected with a node between transistors of said at least one pair of cascoded transistors to produce a signal at said node to control switching of said at least one pair of cascoded transistors;

wherein said at least one current mirror drives said at least one inverter.

2. Apparatus according to claim 1, wherein one transistor in said at least one pair of cascoded transistors constitutes part of at least one current mirror.

3. Apparatus according to claim 2, wherein the other transistor of said at least one pair of cascoded transistors drives an output of said apparatus.

4. Apparatus according to claim 3, further including:

a bias signal input connected to the other transistor of said at least one pair of cascoded transistors.

5. Apparatus according to claim 1, wherein said at least one inverter further includes:

at least one transistor for driving said node of said at least one pair of cascoded transistors in response to said at least one current mirror.

6. Apparatus according to claim 1, wherein said at least one current mirror is of a first conductivity type, said apparatus further including:

at least one additional current mirror of a second conductivity type for controlling said duty cycle of said output square wave.

7. Apparatus according to claim 6, further including:

at least one additional pair of cascoded transistors and at least one additional inverter operatively connected with a node between transistors of said at least one additional pair of cascoded transistors.

8. Apparatus according to claim 7, wherein said at least one additional current mirror drives said at least one additional inverter.

9. Apparatus according to claim 8, wherein said output square wave signal is produced at a junction between said at least one pair of cascoded transistors and said at least one additional pair of cascoded transistors.

10. Apparatus according to claim 1, wherein said processing means is implemented with transistors which are all comparable in physical size.

11. Apparatus according to claim 1, wherein said input signal is a sine wave signal.

12. Apparatus according to claim 1, further including:

means for generating at least one bias signal for driving one transistor of said at least one pair of cascoded transistors.

13. Apparatus according to claim 12, further including:

means for modifying said at least one bias signal in response to feedback from said processing means.

14. Apparatus according to claim 12, wherein said generating means is implemented using transistors which are all of comparable physical size.

15. Method for producing a square wave output signal comprising the steps of:

receiving an input signal; and processing said input signal into an output square wave signal by:

generating an input stage current in response to said input signal;

producing a current mirror signal in response to said generated current;

inverting said current mirror signal to create an inverted current mirror signal; and controlling a switching of said output square wave signal between a source voltage and a ground voltage using at least one cascoded transistor pair driven by said inverted current mirror signal at a node between transistors of said at least one cascoded transistor pair.

* * * * *